United States Patent [19]

Sakairi

[11] Patent Number: 5,801,474

[45] Date of Patent: *Sep. 1, 1998

[54] SURFACE ACOUSTIC WAVE (SAW) DEVICE

[75] Inventor: Natsuhiko Sakairi, Tokyo, Japan

[73] Assignee: NEC Corporation, Tokyo, Japan

[21] Appl. No.: 567,921

[22] Filed: Dec. 6, 1995

[*] Notice: This patent issued on a continued prosecution application filed under 37 CFR 1.53(d), and is subject to the twenty year patent term provisions of 35 U.S.C. 154(a)(2).

[30] Foreign Application Priority Data

Dec. 6, 1994 [JP] Japan .................... 6-302216

[51] Int. Cl.$^6$ .................................. H03H 9/25
[52] U.S. Cl. ............. 310/313 R; 310/344; 310/348
[58] Field of Search ................... 310/313 R, 344, 310/345, 348; 29/25.35

[56] References Cited

U.S. PATENT DOCUMENTS

| | | | |
|---|---|---|---|
| 1,776,009 | 9/1930 | Rieber | 310/348 |
| 2,430,478 | 11/1947 | Nelson | 310/348 |
| 2,440,709 | 5/1948 | Young | 310/348 |
| 2,639,393 | 5/1953 | Birt et al. | 310/348 |
| 2,961,554 | 11/1960 | Cook et al. | 310/348 |
| 4,492,892 | 1/1985 | Nakatani | 310/345 |
| 4,965,483 | 10/1990 | Abe et al. | 310/345 |
| 5,212,115 | 5/1993 | Cho et al. | 437/208 |
| 5,281,883 | 1/1994 | Ikata et al. | 310/313 R |
| 5,699,027 | 12/1997 | Tsuji et al. | 310/313 R |

FOREIGN PATENT DOCUMENTS

| | | | |
|---|---|---|---|
| 62-98340 | 6/1987 | Japan | H03H 9/25 |
| 0263810 | 10/1988 | Japan | 310/313 R |
| 0263811 | 10/1988 | Japan | 310/313 R |
| 0263812 | 10/1988 | Japan | 310/313 R |
| 13261909 | 10/1988 | Japan | 310/313 R |
| 0166818 | 6/1990 | Japan | 310/344 |
| 0240310 | 10/1991 | Japan | 310/344 |
| 4-170811 | 6/1992 | Japan | H03H 9/25 |

*Primary Examiner*—Thomas M. Dougherty
*Attorney, Agent, or Firm*—Scully, Scott, Murphy & Presser

[57] ABSTRACT

A surface acoustic wave (SAW) device in accordance with the present invention is constituted in such a way that a SAW device chip 2 in which electrode patterns are formed is accommodated within a package composed of a ceramic board 1 and a metallic cap 4. The SAW device comprises metallic patterns 5a and 5b provided at the ceramic board 1 as input/output terminals of the package and having convex portions 6a and 6b connected electrically to bonding pads 8a and 8b of a SAW device chip, respectively, and an elastic body 3 arranged between the metallic cap 4 and the SAW device chip 2. The SAW device chip 2 is fixed such that the bonding pads 8a and 8b are pushed against the convex portions 6a and 6b under a predetermined contact pressure by elastic force of the elastic body 3.

5 Claims, 3 Drawing Sheets

SURFACE ACOUSTIC WAVE (SAW) DEVICE

BACKGROUND OF THE INVENTION

1. Field of the Invention

The present invention relates to improvements of a configuration of a surface acoustic wave (SAW) device.

2. Background of the Invention

Description of the Related Art

The present invention relates to improvements of a SAW device, such as a surface acoustic wave (SAW) filter and the like.

In a SAW device, for example, in a SAW filter, an amplitude and a phase thereof can be controlled independent of each other. Thus, it is useful as a communication filter, a digital signal processing filter and the like, and is applied more and more as a light, thin, short and small element. Further, some of them are used actually for a filter of mobile communication equipment and the like.

In a conventional SAW device, as disclosed in the Laid-open Japanese patent application No.4-170811 (document 1), a SAW device chip is packaged by a metallic cap or a cap composed of a ceramic frame and a metallic plate, and a ceramic board, in order to maintain air tightness on a pattern surface of the chip. On the other hand, a type that the SAW device chip itself is used as the cap is proposed in the Laid-open Janpanese utility model application No. 62-98340 (document 2).

However, it requires a fixing process. The fixing (bonding) process occupies a large part of a cost of the SAW device. Thus, the SAW device requiring the fixing (bonding) process has a problem that the process is a large obstruction in reducing the cost. In addition, since the SAW device is connected through a wire to an input/output terminal, there is also a problem that a wire connection thereof is a large obstacle in making the SAW device small.

With the SAW device disclosed in the document 2, a number of processes of mounting the chip is reduced significantly. Since a package is sealed by an adhesive material itself, it is impossible to maintain the air tightness within the package, and there is a problem in view of reliability. In addition, since a lead frame is merely in contact with the SAW device chip, there may be a fear that an abnormal contact occurs due to aging of the device. Thereby, there is a problem that the reliability is insufficient.

SUMMARY OF THE INVENTION

It is therefore an object of the present invention to provide a surface acoustic wave (SAW) device which can solve the respective problems mentioned above and simplify a number of processes of mounting elements and which is high reliable and inexpensive.

The present invention provides a surface acoustic wave (SAW) device, wherein a SAW element in which electrode patterns are formed is accommodated within a package composed of a board and a cap member. The SAW device comprises terminals provided at the board as input/output terminals of the package and having connecting portions connected electrically to predetermined portions of the electrode patterns, and an elastic member arranged between the cap member and the SAW element. The SAW element is fixed such that the predetermined portions of the electrode patterns are pushed against the connecting portions of the terminals under a predetermined contact pressure by elastic force of the elastic member.

The elastic member may be composed of a rubber or a spring. Further, a metallic plate spring may be used as the spring.

With the SAW device of the present invention constituted as mentioned above, the elastic force of the elastic member is used which is arranged between the cap member and the SAW element. That is, in the present invention, when a packaging is carried out by using the cap member, the elastic member and the SAW element are pushed against the board, and thereby deformation is induced in the elastic member. The predetermined portions of the electrode patterns of the SAW element are pushed against the convex portions of the terminals under a constant contact pressure by the elastic force generated by the deformation of the elastic member. Accordingly, the SAW element is fixed. In this way, in the present invention, the SAW element is fixed by the elastic force of the elastic member. As a result, it is not necessary to form a metallic bump on the SAW element and to connect the metallic bump to the input/output terminals and to fix the SAW element on the board, as the prior art. Thereby, it is possible to simplify these processes. Further, since a wire bonding is not necessary, it is possible to make the equipment small. Furthermore, the predetermined portions of the electrode patterns of the SAW element are in contact with and connected to the connecting portions of the terminals under the constant contact pressure. Accordingly, an abnormal contact due to aging of the device and the like does not occur, such as the conventional SAW device in which the predetermined portions of the electrode patterns are merely in contact with the connecting portions of the terminals.

DETAILED DESCRIPTION OF THE PREFERRED EMBODIMENTS

Figure 1:
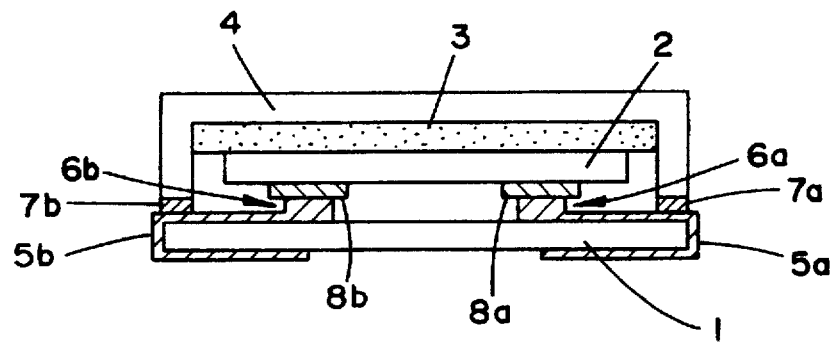
FIG. 1 is a section view showing a general configuration of a SAW device of a first embodiment in accordance with the present invention.

Referring to FIG. 1 showing a first embodiment in accordance with the present invention, laterally U-shaped metallic patterns 5a and 5b are formed in both edges of a ceramic board 1. Each of connecting portions 6a and 6b, which may be convex for example, is formed in each of the metallic patterns 5a and 5b. Each of the metallic patterns 5a and 5b is an input/output terminal of a package described later, and is formed, for example, by a film whose surface layer consists of Au, Al, Cu and the like.

A SAW device chip 2 is adapted such that a pattern (for example, a comb-shaped element) composed of an aluminum thin film is formed on a piezoelectric material. In FIG. 1, a pattern forming surface is located on a bottom side. In this SAW device chip 2, bonding pads 8a and 8b are formed in predetermined positions when the element pattern is formed. Each of the bonding pads 8a and 8b is a connection portion to each of the above mentioned metallic patterns 5a and 5b in the pattern.

An elastic body 3 is an elastic member having a predetermined thickness. For example, a silicon rubber or the like is used. A size of the elastic body 3 is adapted to be accommodated within a metallic cap 4 described below.

The metallic cap 4 is in a shape of a cap, and carries out a packaging of the SAW device chip 2 and the elastic body 3 provided on the ceramic board 1. The packaging is carried out such that a circumference of the ceramic board 1 and that of the metallic cap 4 are sealed in sealing portions 7a and 7b, respectively, for example, by welding or soldering.

In this embodiment, by the packaging mentioned above, each of the bonding pads 8a and 8b of the SAW device chip 2 is in contact with each of the connecting portions 6a and 6b of the metallic patterns 5a and 5b provided on the both edges of the ceramic board 1. A contact pressure thereof is maintained in excess of a constant value by elastic force of the elastic body 3.

In the SAW device constituted as mentioned above, the element is mounted as described below.

The SAW device chip 2 is arranged on the ceramic board 1 on which the metallic patterns 5a and 5b are formed according to a determined procedure, in such a way that each of the bonding pads 8a and 8b are in contact with each of the connecting portions 6a and 6b of the metallic patterns 5a and 5b. Further, the elastic body 3 is arranged on the SAW device chip 2. Continuously, the metallic cap 4 is put on, from an upper direction of the SAW device chip 2 and the elastic body 3 arranged respectively on the ceramic board 1. Then, the respective circumferences of the metallic cap 4 and the ceramic board 1 are sealed.

When the respective circumferences of the metallic cap 4 and the ceramic board 1 are sealed as mentioned above, the SAW device chip 2 and the elastic body 3 are pushed against the ceramic body 1, from the upper direction, by the metallic cap 4, and thereby deformation is induced in the elastic body 3. Elastic force is generated by the deformation of the elastic body 3. The bonding pads 8a and 8b are in contact with and connected to the connecting portions 6a and 6b of the metallic patterns 5a and 5b by a contact pressure in excess of a constant value. Accordingly, the SAW device chip 2 is fixed without getting out of position.

As mentioned above, in this embodiment, there is no process of bonding the SAW device chip 2 and the terminals 5a and 5b together (a process of fixing the chip). Merely, the mounting is carried out only in such a way that the SAW device chip 2 and the elastic body 3 are overlapped sequentially on the terminals 5a and 5b and then the packaging is performed. Thus, it is possible to reduce a number of the processes of assembling the device.

In the SAW device constituted as mentioned above, the metallic patterns 5a and 5b outside the package are used as the input/output terminals, and the SAW device is driven. Although only the two metallic patterns 5a and 5b are shown, as the metal patterns, conveniently in FIG. 1, actually, the terminals for inputting and outputting are provided respectively.

Next, other embodiments in accordance with the present invention will be described with reference to FIGS. 2 through 5, respectively.

Figure 2:
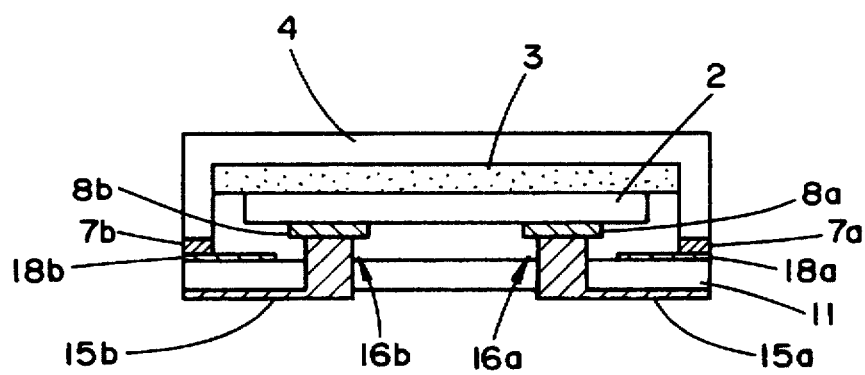
FIG. 2 is a section view showing a general configuration of a SAW device of a second embodiment in accordance with the present invention.

FIG. 2 is a section view showing a general configuration of a SAW device of a second embodiment in accordance with the present invention.

The SAW device shown in FIG. 2 has a configuration similar to that of the first embodiment described above, except that forming of the metallic patterns to the ceramic board is different. In FIG. 2, the same reference numerals are given to the same configuration parts as those of the first embodiment.

In the SAW device of this embodiment, penetration holes are opened on predetermined portions of the ceramic board 1. Metal patterns 15a and 15b and via hole (penetration aperture) portions 16a and 16b are formed by using the penetration holes mentioned above. The metallic patterns 15a and 15b are the input/output terminals of the package. Forming of the via hole portions 16a and 16b are normally carried out by making amount of filled metallic powder more, when the holes opened on the ceramic board 1 is filled with the metallic powder. For this end, in this embodiment, it is possible to simply form connecting portions on the board. As a result, effect is obtained in which it is easy to form the connecting portions of the metallic patterns, as compared with the first embodiment.

Incidentally, in this embodiment, metallic portions 18a and 18b for sealing are formed in a circumference portion of the ceramic board 1. Then, a packaging is carried out by welding or soldering the metallic portions 18a and 18b to the circumference portion of the metallic cap 4.

In the cases of the first and second embodiments mentioned above, the elastic body is used in order to push the bonding pads of the SAW device against the connecting portions of the metallic patterns. However, it is enough that this elastic body has the elastic force which can fix the bonding pads to the connecting portions of the metallic patterns. For example, a plate spring may be used. A SAW device using a metallic plate spring will be described hereinafter.

Figure 3:
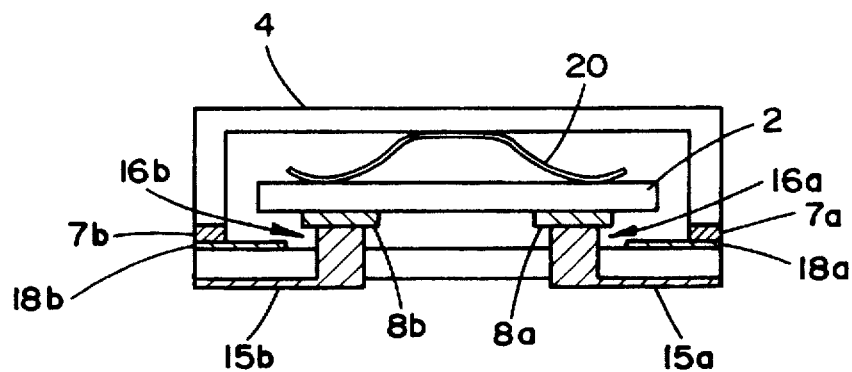
FIG. 3 is a section view showing a general configuration of a SAW device of a third embodiment in accordance with the present invention.

FIG. 3 is a section view showing a general configuration of a SAW device of a third embodiment in accordance with the present invention.

The SAW device shown in FIG. 3 has a configuration similar to that of the second embodiment described above, except that a metallic plate spring 20 is used instead of the elastic body 3. In FIG. 3, the same reference numerals are given to the same configuration parts as those of the first embodiment.

In the SAW device of this embodiment, when a packaging is carried out by using a metallic cap 4, each of bonding pads 8a and 8b of a SAW device chip 2 is pushed against each of via hole portions 16a and 16b (connecting portions) of metallic patterns 15a and 15b, by spring action of a metallic plate spring 20, and a contact pressure thereof is maintained in excess of a constant value. Accordingly, a SAW device chip 2 is fixed without getting out of position.

As mentioned above, also in this embodiment, there is no process of bonding the SAW device chip 2 and the terminals together (a process of fixing the chip) similarly to the first and second embodiments. Merely, a mounting is carried out only in such a way that the SAW device chip 2 and the metallic plate spring 20 are overlapped sequentially on the terminals and then a packaging is performed. Thus, it is possible to reduce a number of the processes of assembling the device.

If an insulator is used for the elastic body, there may be a case where gas is released from the insulator after the packaging (sealing). However, in this embodiment, since the metallic is used for the plate spring as mentioned above, effect is obtained in which there is no need to consider the gas released from the insulator.

In the SAW devices of the respective embodiments mentioned above, the package is formed by using the ceramic board and the metallic cap. However, it is possible to use a metallic board, instead of the ceramic board, in order to reduce a cost. An embodiment will be described hereinafter in which the metallic board is used instead of the ceramic board.

Figure 4:
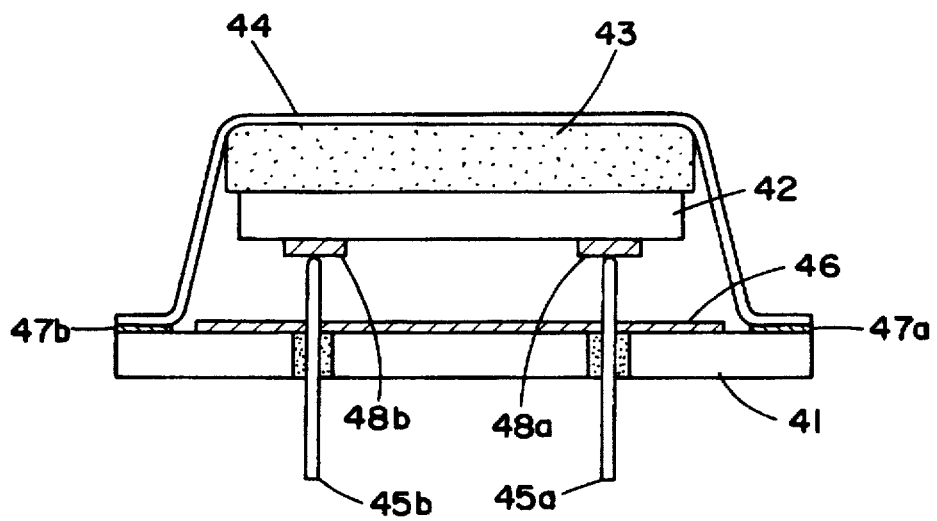
FIG. 4 is a section view showing a general configuration of a SAW device of a fourth embodiment in accordance with the present invention.

FIG. 4 is a section view showing a general configuration of a SAW device of a fourth embodiment in accordance with the present invention.

In FIG. 4, the SAW device comprises a metallic board 41, a SAW device chip 42, an elastic body 43, a metallic cap 44, bar-shaped terminals 45a and 45b, an insulation sheet 46, sealing portions 47a and 47b and bonding pads 48a and 48b. Incidentally, the SAW device chip 42 and the elastic body 43 have configurations similar to those of the first through the third embodiments mentioned above, respectively. The bonding pads 48a and 48b are formed on the SAW device chip 42.

In the SAW device of this embodiment, a metallic package is formed by using the metallic board 41 and the metal cap 44. A configuration thereof and a mounting of the device will be described hereinafter.

The metallic board 41 is provided with penetration holes for passing the terminals 45a and 45b through predetermined portions, respectively. The insulation sheet 46 is formed on an inner surface of the package. The terminals 45a and 45b are passed through the penetration holes of the metallic board 41, and are fixed, with insulation members, at areas of the penetration holes so as to protrude inside the package. The terminals 45a and 45b are fixed, for example, by passing the terminals 45a and 45b through the penetration holes of the metallic board 41, filling the areas of the penetration holes with glass powder and burning.

In this embodiment, the SAW device chip 42 is arranged such that the terminals 45a and 45b protruded inside the package are in contact with the bonding pads 48a and 48b of the SAW device chip 42, respectively. Then, the elastic body 43 is arranged on the SAW device chip 42. After that, they are packaged by using the metallic cap 44 similarly to the first through the third embodiments mentioned above.

As mentioned above, when the packaging is carried out by using the metallic cap 44, the bonding pads 48a and 48b are pushed against the terminals 45a and 45b, respectively, by spring force of the elastic body 43, and a contact state between the pads and the terminals is maintained by a contact pressure in excess of a constant value. Accordingly, the SAW device chip 42 is fixed without getting out of position.

As mentioned above, also in this embodiment, there is no process of bonding the SAW device chip 42 and the terminals 45a and 45b together (a process of fixing the chip) similarly to the first through the third embodiments. Merely, a mounting is carried out only in such a way that the SAW device chip 42 and the elastic body 43 are overlapped sequentially on the terminals 45a and 45b and then the packaging is performed. Thus, it is possible to reduce a number of the processes of assembling the device.

Here, although the device using the metallic board instead of the ceramic board has been described, it is possible to use an insulation member, such as glass and the like, instead of the ceramic board. A SAW device will be described hereinafter which uses the insulation member, such as the glass and the like, instead of the ceramic board.

Figure 5:
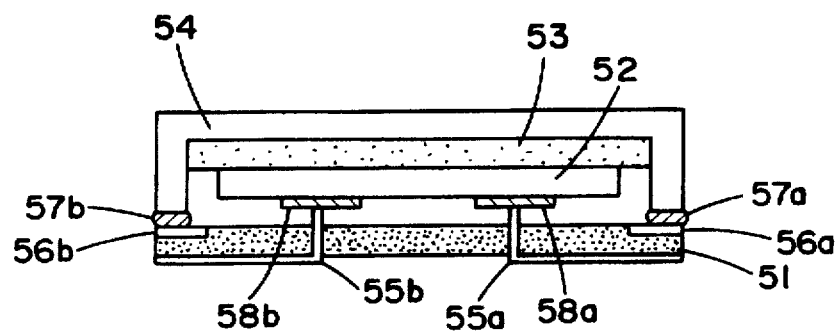
FIG. 5 is a section view showing a general configuration of a SAW device of a fifth embodiment in accordance with the present invention.

FIG. 5 is a section view showing a general configuration of a SAW device of a fifth embodiment in accordance with the present invention.

In FIG. 5, the SAW device includes an insulation member 51 using glass and the like, a SAW device chip 52, an elastic body 53, a metallic cap 54, metallic terminals 55a and 55b, metallic portions 56a and 56b, sealing portions 57a and 57b and bonding pads 58a and 58b. Incidentally, the SAW device chip 52 and the elastic body 53 have configurations similar to those of the first through the third embodiments mentioned above, respectively. The bonding pads 58a and 58b are formed on the SAW device chip 52. In the SAW device of this embodiment, a package is formed by using the insulation member 51 and the metallic cap 54. A configuration thereof and a mounting of the device will be described hereinafter.

The insulation member 51 is provided with penetration holes for passing the metallic terminals 55a and 55b through predetermined portions, respectively. The metallic portions 56a and 56b are formed at areas of the sealing portions 57a and 57b of a circumference portion of the insulation member. The metallic portions 56a and 56b are bonded to the circumference portion of the metallic cap 54 by welding (or soldering), and thereby sealing is carried out.

The metallic terminals 55a and 55b are passed through the penetration holes of the insulation members 51, and are fixed at areas of the penetration holes so as to protrude inside the package, and are creeping along the insulation member 51. The metallic terminals 55a and 55b are fixed, for example, by passing the metallic terminals 55a and 55b through the penetration holes of the insulation member 51, filling the areas of the penetration holes with glass powder and burning.

In this embodiment, the SAW device chip 52 is arranged at a position at which each of the metallic terminals 55a and 55b protruded inside the package is in contact with each of the bonding pads 58a and 58b. Then, the elastic body 53 is arranged on the SAW device chip 52. After that, they are packaged by using the metallic cap 54 similarly to the first through the fourth embodiments mentioned above.

As mentioned above, when the packaging is carried out by using the metallic cap 54, also in this embodiment, the bonding pads 58a and 58b are pushed against the metallic terminals 55a and 55b, respectively, by spring force of the elastic body 53. Thus, a contact state between the pads and the terminals is maintained by a contact pressure in excess of a constant value. Accordingly, the SAW device chip 52 is fixed.

As mentioned above, also in this embodiment, there is no process of bonding the SAW device chip 52 and the metallic terminals 55a and 55b together (a process of fixing the chip) similarly to the first through the fourth embodiments. Merely, a mounting is carried out only in such a way that the SAW device chip 52 and the elastic body 53 are overlapped sequentially on the metallic terminals 55a and 55b and then the packaging is performed. Thus, it is possible to reduce a number of the processes of assembling the device.

Incidentally, in the SAW devices in accordance with the present invention, it is enough that a metallic cap can package a SAW device chip and an elastic body together. A shape of the metallic cap is not especially limited, and it may be selected properly based on design conditions.

Further, in the above mentioned SAW devices in accordance with the present invention, the plate spring is used only in the third embodiment. However, it is possible to use the plate spring in the other embodiments. In the case where the plate spring is used, it is natural to be able to get the action effect similar to the third embodiment.

What is claimed is:

1. A method of forming a surface acoustic wave (SAW) device comprising the steps of:

forming at least one hole through a substrate;

forming an electrode pattern on a first surface of said substrate, said electrode pattern having projections filling said at least one hole to extend above a second surface of said substrate, said second surface being opposite said first surface;

positioning a SAW element having bonding pads over said substrate such that said bonding pads are in electrical and physical contact with said projections;

positioning an elastic member over said SAW element; and positioning a cap over said elastic member and attaching sidewall of said cap to said substrate;

wherein said elastic member pushes said SAW element toward said substrate 11 to maintain said electrical and physical contact.

2. The method of claim 1, wherein said elastic member is rubber.

3. The method of claim 1, wherein said elastic member is a spring.

4. The method of claim 1, wherein said elastic member is a metallic plate spring.

5. A method of forming a surface acoustic wave (SAW) device comprising the steps of:

forming at least one hole through a substrate;

forming an electrode pattern on a first surface of said substrate while simultaneously forming projections filling said at least one hole to extend above a second surface of said substrate, said second surface being opposite said first surface;

positioning a SAW element having bonding pads over said substrate such that said bonding pads are in electrical and physical contact with said projections;

positioning an elastic member over said SAW element; and positioning a cap over said elastic member and attaching sidewall of said cap to said substrate;

wherein said elastic member pushes said SAW element toward said substrate to maintain said electrical and physical contact.

* * * * *